(12) United States Patent
Jia et al.

(10) Patent No.: US 7,372,379 B1
(45) Date of Patent: May 13, 2008

(54) METHOD AND SYSTEM FOR DECODING N-TUPLE VARIABLE LENGTH CODE

(75) Inventors: Wei Jia, Sunnyvale, CA (US); Parthasarathy Sriram, Los Altos, CA (US); Jessica Fang, Cupertino, CA (US)

(73) Assignee: NVIDIA Corporation, Santa Clara, CA (US)

( * ) Notice: Subject to any disclaimer, the term of this patent is extended or adjusted under 35 U.S.C. 154(b) by 40 days.

(21) Appl. No.: 11/392,096

(22) Filed: Mar. 28, 2006

(51) Int. Cl.
 *H03M 7/40* (2006.01)
(52) U.S. Cl. .......................................... 341/67; 341/65
(58) Field of Classification Search ............. 341/50–70
 See application file for complete search history.

(56) References Cited

U.S. PATENT DOCUMENTS 6,587,057 B2 * 7/2003 Scheuermann ............... 341/67
7,113,115 B2 * 9/2006 Partiwala et al. ............. 341/67
7,129,862 B1 * 10/2006 Shirdhonkar et al. ......... 341/67
7,132,963 B2 * 11/2006 Pearlstein et al. ............ 341/67
7,289,047 B2 * 10/2007 Nagori ........................ 341/67

* cited by examiner

*Primary Examiner*—Lam T. Mai

(57) ABSTRACT

This application provides a flexible and efficient way to handle escape symbols during decoding of N-tuple variable length codes (VLCs). The user can request that the decoder resolve a sequence of symbols. The Huffman lookup tables can contain a field to notify the decoder if a given N-tuple VLC includes an escape symbol. For non-escape symbols, as identified by the escape indicator bit in the Huffman lookup table entry, the decoder can finish resolving the N symbols of the N-tuple without requiring a symbol-by-symbol comparison of each symbol to detect escape conditions. For escape symbols, as identified by the escape indicator bit in the Huffman lookup table entry, the decoder can either look back to the user for help, or use pre-defined logic to resolve the escape symbols. Aspects of certain embodiments enable parallelism between Huffman symbol decoding and escape condition detection without losing future expandability.

30 Claims, 4 Drawing Sheets

METHOD AND SYSTEM FOR DECODING N-TUPLE VARIABLE LENGTH CODE

BACKGROUND OF THE INVENTION

1. Field of the Invention

Generally, this application relates to data decoding. More specifically, this application relates to methods and systems for the efficient handling of escape code during the decoding of N-tuple variable length codes.

2. Description of the Related Art

Advanced audio coding ("AAC") and MPEG, layer 3 (MP3), methods are used in various applications implementing audio codecs, including wireless, CATV, digital broadcast and Internet arenas. The AAC standard specification is ISO/IEC 13818-7, and the MP3 standard specification is ISO/IEC 11172-3, layer III, both of which are fully incorporated herein by reference. AAC generally provides higher efficiency audio encoding than MP3 encoding. However, both AAC and MP3 decoder technologies rely on Huffman coding and decoding of symbols using variable length fields. In the MP3 and AAC specifications, each variable length bit field can represent, for example, values for 2 or 4 consecutive symbols. For convenience, such groups of symbols will be referred to generally as an N-tuple symbol, where the "N" signifies the number of symbols encoded.

Generally, Huffman coding and decoding is based on a statistical algorithm, which means that the probability of occurrence of a symbol has a direct bearing on the length of its code representation. The higher probable the occurrence of a symbol, the shorter its bit-size representation. Huffman lookup tables are used during decoding to reconcile the variable length codes to the encoded symbols.

Huffman tables used during decoding can require escape handling for some symbols. Escape handling may be required when the coded symbol set is big. For example, to achieve efficient coding for more frequently used symbols, it is a typical practice to put some less frequently used symbols in a group, and then to use one special Huffman code to represent this group. Inside the group, each symbol is assigned with a distinct value in addition to the special Huffman code. This practice is known as escape handling. The value corresponding to the special Huffman code is called the escape value or escape threshold. Usually, media standards use different escape values; for example, AAC uses a value of 16, while MP3 uses a value of 15. Furthermore, the number of additional bits assigned to escape symbols varies from standard to standard.

There are generally two typical implementations of escape handling during decoding using Huffman tables. The first typical implementation resolves the symbols one by one to determine whether escape handling is required, with escape intervention provided by the processor or controller in conjunction with the associated escape software. The second typical implementation also resolves the symbols one by one; however the escape handling logic is hard-wired for the specific standard. Thus, the detection of escape symbols depends on a comparison of all N-tuple values against the escape value, or escape threshold, defined by a particular standard. Such conventional implementations result in poor computing performance because of this symbol-by-symbol comparison of each value in the N-tuple symbol.

FIG. 1 illustrates the typical Huffman decoding of an AAC or MP3 bit stream, which uses the detection of escape symbols. This typical detection procedure depends on the comparison of all of the values of an N-tuple symbol against the media-standard-dependent escape value, or escape threshold. As shown in FIG. 1, steps 110-130 start the N-tuple symbol decode process by initialing the decoder to read the variable length code (VLC) and performing variable length decoding (VLD) lookup(s). At steps 140, the decoder has returned the N values of the N-tuple fields. The decoder next compares, at steps 150, each of the N output values against the media-standard-dependent escape threshold(s) to determine whether any of the N values is indicative of an escape symbol. Step 160 decides whether any of the N output values indicates an escape symbol. If none of the N values is an indicator of an escape symbol, then this N-tuple symbol is not an escape condition and decoding of the N-tuple is complete (step 180). Otherwise, the N-tuple symbol is an escape code and requires further handling (step 170), prior to completion of decoding for that N-tuple (step 180).

Typically, the required further handling of step 170 can be implemented in one of two ways. In the first implementation, if comparison of one of the N symbols indicates an escape code, the user (i.e., the CPU, processor, controller, firmware, software, and the like, or combinations thereof, etc.) will read more bits in order to fully resolve the escape symbol. This implementation requires intervention by the user and leads to poor computing performance. The second implementation hard-codes the escape handling logic for a specific standard and if the decoder detects an escape code, it will read more bits to resolve the escape symbol using the pre-defined logic. This implementation has limited usage since the logic is fixed for one specific standard. These typical implementations are further inefficient because the decoder must individually resolve each of the N-symbols before it can determine if the N-tuple is indicative of an escape condition. Typically, the escape codes are themselves rare. However, the comparison must be made on a symbol-by-symbol basis even for all of the non-escape symbols.

Therefore, what are needed are methods and systems for the efficient detection and handling of escape codes for a variety of standards during the decoding of N-tuple variable length codes.

BRIEF DESCRIPTION OF THE DRAWINGS

Aspects and features will become apparent to those ordinarily skilled in the art from the following detailed description of certain embodiments in conjunction with the accompanying drawings, wherein.

DETAILED DESCRIPTION

Certain embodiments will now be described in detail with reference to the drawings, which are provided as illustrative examples so as to enable those skilled in the art to practice the embodiments and are not meant to limit the scope of this application. Where certain elements of embodiments can be partially or fully implemented using known components or steps, only those portions of such known components or steps that are necessary for an understanding of the embodiments will be described, and detailed description of other portions of such known components or steps will be omitted so as to not obscure the embodiments. Further, certain embodiments are intended to encompass presently known and future equivalents to the components referred to herein by way of illustration.

Certain embodiments provide flexible and efficient ways to handle escape symbols for N-tuple variable bit length fields, or variable length codes (VLCs). The Huffman lookup tables can contain a field (i.e., an escape indicator field) to notify the decoder if a given N-tuple VLC includes an escape symbol. The user (i.e., the CPU, processor, controller, firmware, software, and the like, or combinations thereof, etc.) can request that the decoder resolve a sequence of symbols. For non-escape symbols, as identified in the escape indicator field, or bit, in the Huffman lookup table, the decoder can finish resolving the N symbols of the N-tuple without requiring a symbol-by-symbol comparison of all of the N-tuple values to detect escape codes. For escape symbols, again, as identified in the escape indicator bit in the Huffman lookup table, the decoder can either look back to the user for help, or use pre-defined (e.g., hard-coded, hard-wired, etc.) escape code logic to resolve the escape symbols. Aspects of certain embodiments enable parallelism between Huffman symbol decoding and escape condition detection without losing future expandability.

Certain embodiments can be used to decode, for example, an MP3 or AAC variable length code (VLC) bit stream and/or included in an associated decoder. Such a decoder (i.e., hardware, software and combinations thereof) and decoding methodology that might include certain embodiments is illustrated in commonly-assigned U.S. patent application Ser. No. 11/293,708, filed on 1 Dec. 2005 and entitled "Efficient Decoding of N-Tuple Variable Bit Length Symbols," which is fully incorporated herein by reference for all purposes. However, similar decoders and decoding methodologies can also include certain embodiments. Further, the decoder and decoding methodology of the certain embodiments are not tied to any one media standard, since a Huffman lookup table is configured independently of any specific standard. Certain embodiments not only allow pre-defined escape handling for existing standards, but also enable future media standards to use the same decoder design with external help for escape handling.

Figure 2A:
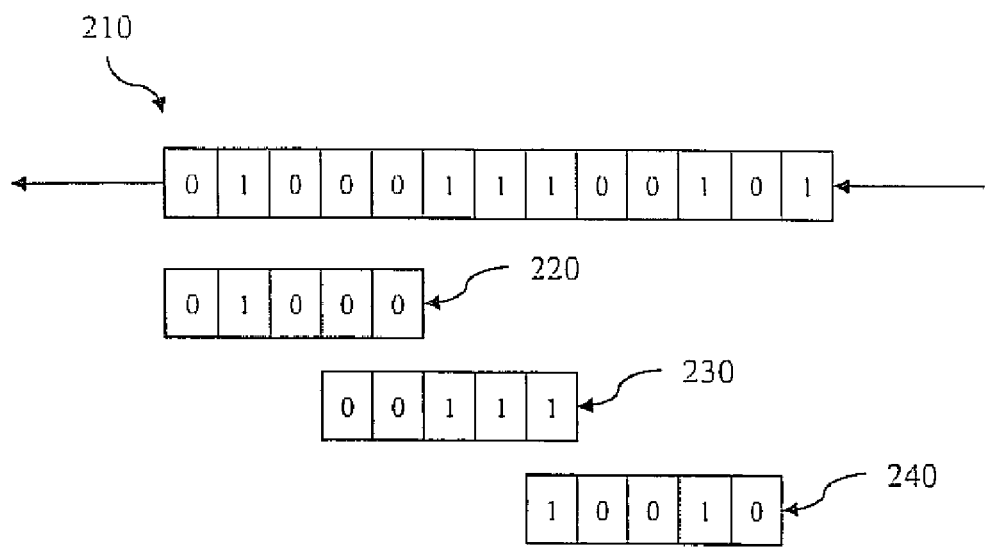
FIGS. 2a-2b illustrate an exemplary implementation of a decode methodology that utilizes certain embodiments.

In certain embodiments, one or more bits can be added in the output value of lookup tables to specify whether a specific N-tuple is indicative of an escape code. These one or more bits will be illustratively referred to herein as an escape indicator bit. In an exemplary decoder implementation of certain embodiments, with reference to FIGS. 2a-2b, a number of bits sufficient to access a decode table is extracted from a bit sequence in data stream 210 to form one or more pre-fetches 220-240. In this example, the pre-fetch length is configured to be 5 bits in length, to match a maximum size of a codeword generated by the encoding table. However, any desired number of bits needed to access an associated decode table, or in some instances more bits than may be needed, can be retrieved from bit sequence 210 and used to populate each pre-fetch 220-240.

Upon populating first pre-fetch 220, the pre-fetch is used as an index to a decode table to obtain a first decoded value, which can be, for example, an eight bit word 250. In this example, eight bit word 250 in the decode table can include fields that are named for the purposes of this discussion: a symbol field 260, a length field 270, a terminal field 280, and an escape indicator field 290. Of course, the pre-fetch bit amount and the decode table word length can vary, as can the number of fields within a word and quantity of bits within each field, including escape indicator field 290. In this example, each symbol can be decoded if 5 bits of pre-fetch information 220-240 are available and terminal field 280 is set to "1" for every entry, to indicate that a symbol is decoded in every table element. However, as shown, certain symbols can be decoded with fewer than 5 bits. First pre-fetch 220 may be decoded, based on the associated decode table, using its first three bits, which means that second pre-fetch 230 would begin its bit sequence with what was the fourth bit of first pre-fetch 220. Likewise, second pre-fetch 230 may be decoded using its first four bits, and third pre-fetch 240 would begin its bit sequence with what was the fifth bit of second pre-fetch 230.

Figure 1:
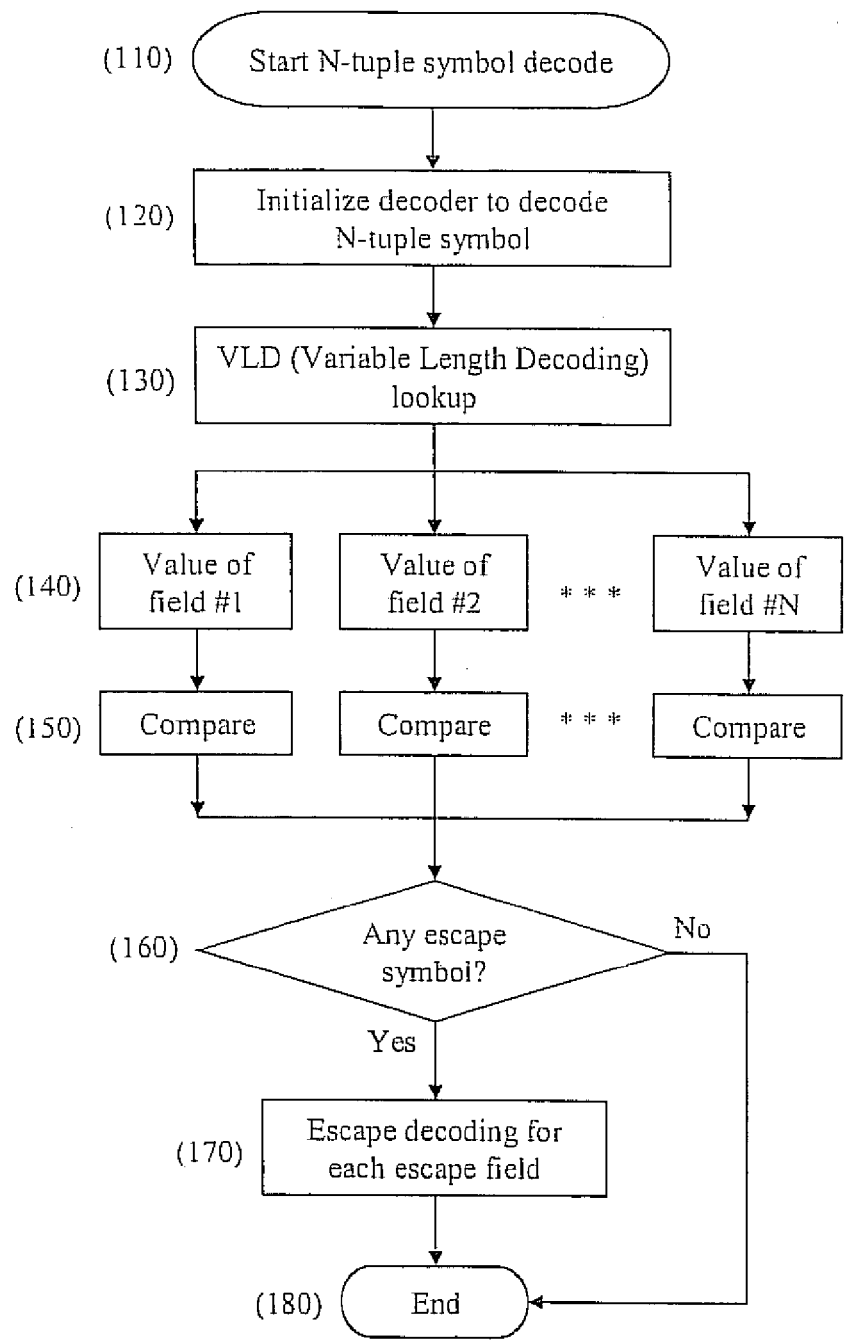
FIG. 1 illustrates the typical Huffman decoding of an AAC or MP3 bit stream, which requires the detection of escape symbols.

Using escape indicator field 290 according to certain embodiments, the decoder can invoke escape handling without hard-coding the escape threshold values for each media standard, and it is also independent of whether the N-tuple is a 2-tuple or 4-tuple. In certain embodiments, the detection of an escape condition is simplified to a simple bit check of escape indicator field 290. This simple bit check can save processing time for non-escape symbols, which are the most frequent in bit stream, and it can also improve the control logic. Non-escape symbol processing time is saved, as compared to the typical approach as illustrated in FIG. 1, because the symbol-by-symbol comparison need not be accomplished.

Figure 2B:
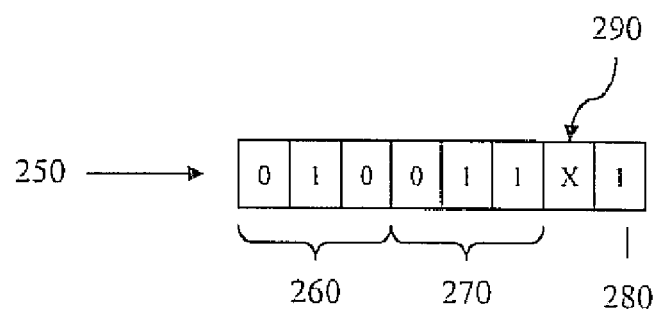
Figure 3:
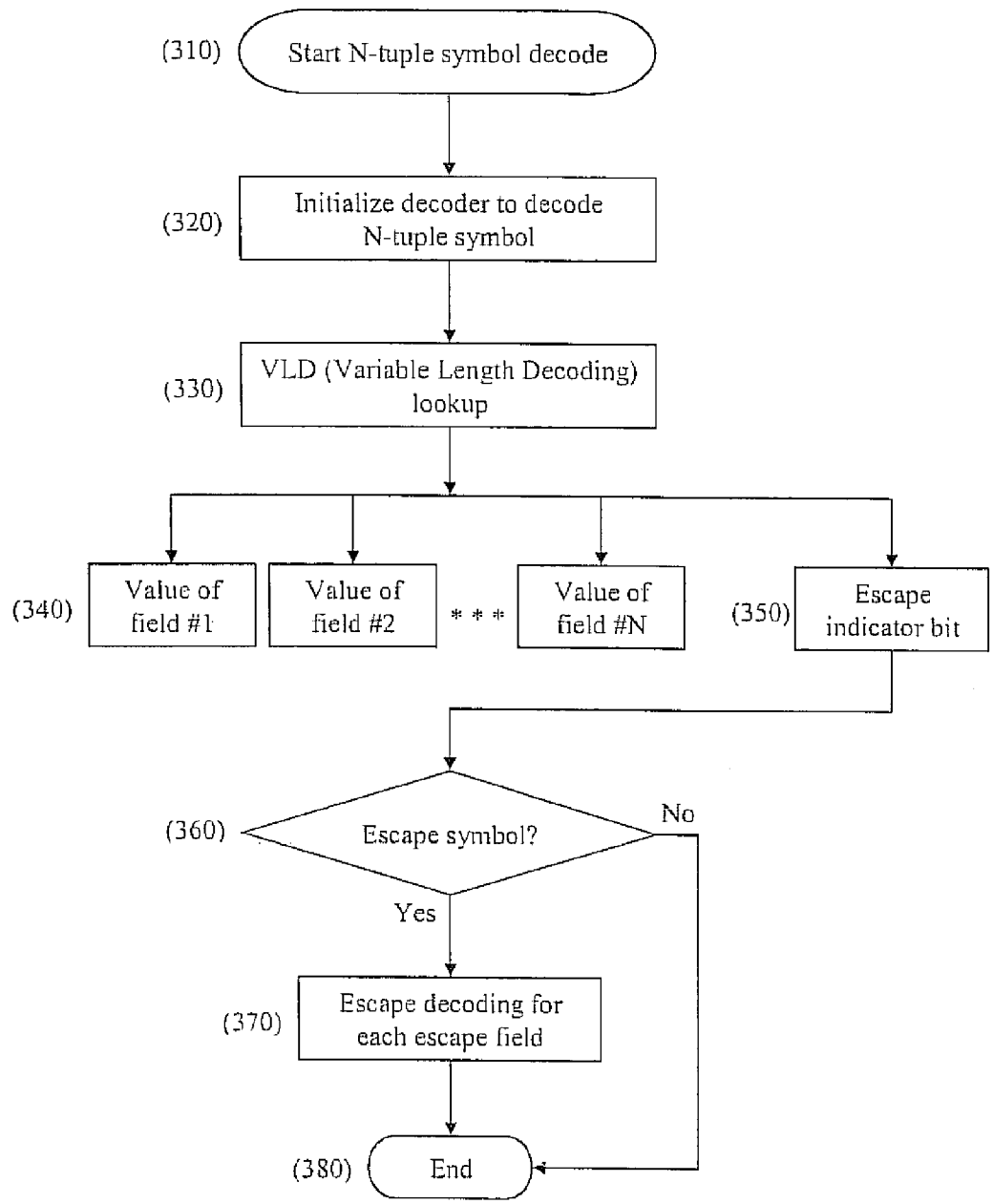
FIG. 3 illustrates an improved decoding methodology using an escape indicator bit according to certain embodiments.

FIG. 3 illustrates an improved decoding methodology using an escape indicator bit, as illustratively discussed with reference to field 290 of FIG. 2b, according to certain embodiments. As shown in FIG. 3, the escape detection includes steps 310-330, which can start the N-tuple symbol decode process by initializing the decoder to read the variable length code (VLC) and performing variable length decoding (VLD) lookup(s). These beginning steps can be performed, for example, as discussed with reference to bit stream 210 and pre-fetches 220-240 of FIGS. 2a-2b. At steps 340, the decoder has returned the N values of the N-tuple fields (e.g., decode table value 250, etc.). Substantially in parallel with steps 340, at step 350, the decoder has also returned one or more escape indicator bits (e.g., from escape field 290 of decode table value 250, etc.) to determine whether any of the N values is indicative of an escape symbol. Step 360 decides whether the escape indicator bit(s) indicates an escape symbol, without needing to compare each of the N values of the N-tuple symbol to an escape threshold. If escape indicator bit 350 is not indicative of an escape symbol, then this N-tuple symbol is not an escape condition and decoding of the N-tuple is complete (step 380). Otherwise, the N-tuple symbol is an escape code and requires further handling (step 370) prior to completion of decoding for that N-tuple (step 380).

According to certain embodiments, the decision whether the escape indicator bit(s) indicates an escape condition (at step 360) can be accomplished in many different ways, all of which are intended to be within the scope of this application. For example, in some cases, one or more bits might be good enough to indicate an escape condition for the entire N-tuple, while in other cases, one or more bits for each symbol within the N-tuple may be necessary. The determination performed at step 360 can be as simple as a one-bit check, or much more complicated, to include Boolean logic on multiple bits for each of the multiple symbols within the N-tuple.

As will now be evident to those skilled in the art, if sufficient space is available in the Huffman lookup table, more bits can be added in the output value to specify which fields (in the N-tuple) need to be handled separately. Further, one or more bits can be added at the media-standard level, based on the media-standard, to improve expandability of certain embodiments. Such a bit might be, for example, one or more use external help bits. With the use external help bit, the decoder might also hard-code escape handling logic for certain existing standards, while keeping expandability for future standards.

Figure 4:
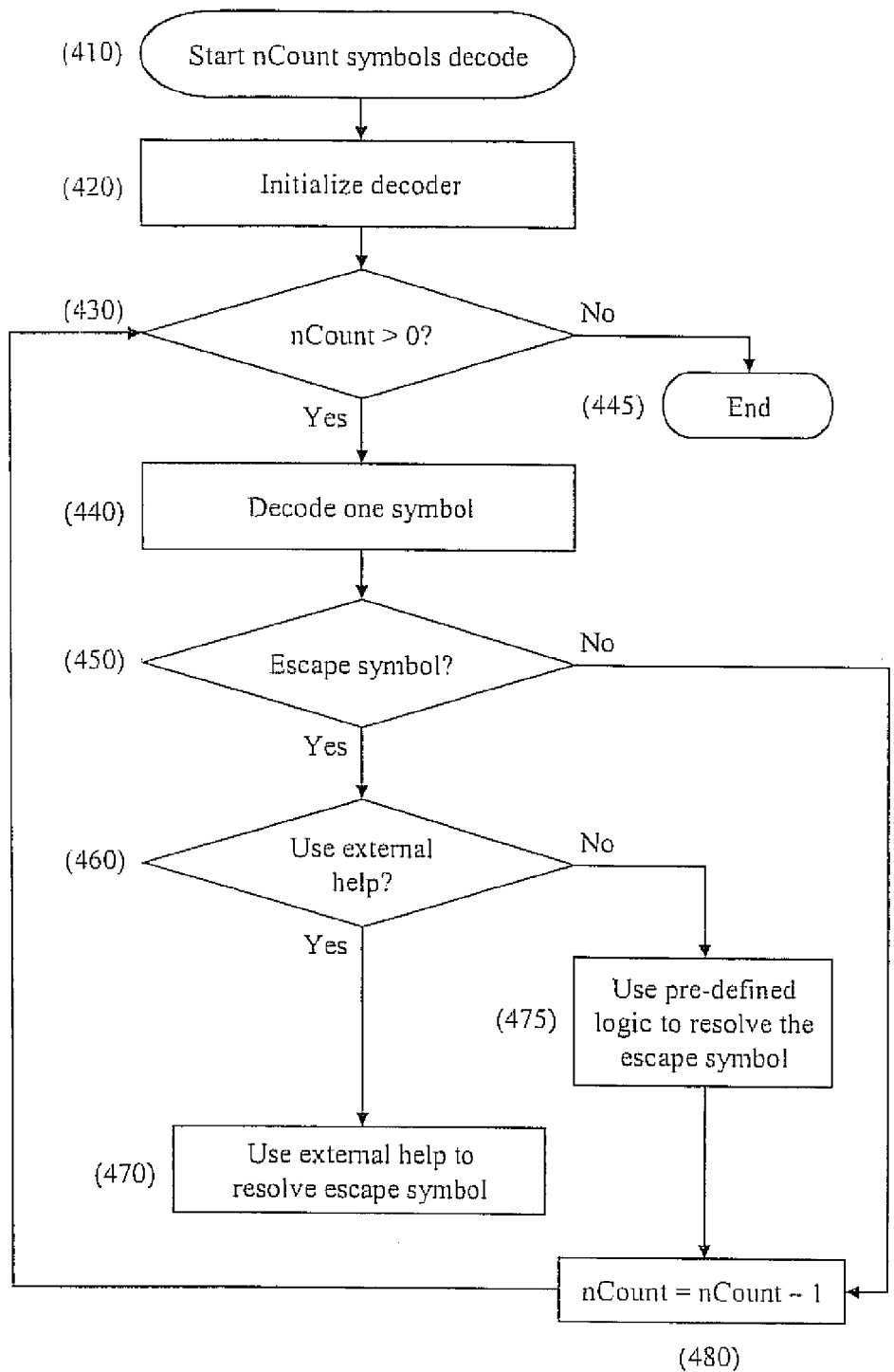
FIG. 4 illustrates an exemplary methodology that shows decoding a sequence of Huffman symbols in a single request according to certain embodiments.

FIG. 4 illustrates an exemplary methodology that shows decoding a sequence of Huffman symbols in a single request according to certain embodiments. As shown in FIG. 4, the exemplary decode sequence starts at step 410, which can start decoding the sequence of symbols by setting a variable, nCount, equal to the number of Huffman symbols requested for decoding. Then, at step 420, the decoder is initialized to begin reading the sequence of Huffman symbols. At step 430, nCount is compared to zero (i.e., checking whether at least one more Huffman symbol is requested to be decoded). If nCount is equal to zero, then this request is complete (step 445). If nCount is greater than zero, then the decoder lookup returns one value for one Huffman symbol (step 440). Next, at step 450, the escape indicator bit of the decoded symbol can be checked to see whether this symbol is an escape condition. If not, then decoding of this symbol is complete and nCount can be decremented by one (step 480) and the decoding process continues with another nCount check (step 430).

If, at step 450, the escape indicator bit indicates an escape condition, then a check against the use external help bit can be performed at step 460. If the use external help bit check indicates that external help is needed for this escape condition, then, at step 470, the decoder can use interrupt means, or other asynchronous means, to tell the user that an escape symbol is indicated. The decoder can also return its current status to the user, such as, for example, the number of resolved symbols from the total requested, and the like. Then, the decoder is finished with this request and waits for the next request. The user can resolve the escape symbol, re-calculate how many more symbols are needed to be decoded, and issue a new request for the remaining symbols to the decoder. Alternatively, if the check of the use external help bit indicates that external help is not needed for this escape condition, then, at step 475, pre-defined logic can be used to resolve the escape symbol. Once the pre-defined logic resolves the escape symbol, then nCount can be decremented and control passed back to step 430 for another nCount check.

In certain embodiments, recursive escape handling can be performed per some media standards, which means that there might be escape symbols within an escape sequence. In the case of using external help to resolve an escape sequence, the decoder can detect the first level of escapes and then hand control back to the user. The user can resolve the escape symbol recursively as necessary. Once the recursive escape sequence is resolved, the user can recalculate the number of symbols that might be needed for decoding and issue a new request to the decoder. In the case of using pre-defined logic to resolve an escape sequence, the hard-coded logic can resolve all of the escape symbols within the recursive escape sequence.

As described herein, certain embodiments provide a flexible and configurable way to decode a sequence of Huffman symbols. The occurrence of escape symbols is statistically rare in the bit stream. Thus, the decoder is capable of finishing decoding of the non-escape symbols within a single request. The non-escape symbols can be resolved without any user intervention (e.g., symbol comparison to escape threshold(s), etc.). In the case of resolving escape symbols within the N-tuple, external help and/or pre-defined logic can be used. Thus, the certain embodiments can result in better performance and make parallelism possible. Further, certain embodiments are expandable to future media standards.

Although the application has been particularly described with reference to certain embodiments, it should be readily apparent to those of ordinary skill in the art that various changes, modifications, substitutes and deletions are intended within the spirit and scope thereof. Accordingly, it will be appreciated that in numerous instances some features can be employed without a corresponding use of other features. Further, those skilled in the art will understand that variations can be made in the number and arrangement of inventive elements illustrated and described in the above figures. It is intended that the scope of the appended claims include such changes and modifications.

What is claimed is:

1. A method for decoding a data stream, the method comprising the steps of:
    performing variable length decoding (VLD) lookup for an N-tuple symbol using a Huffman lookup table;
    returning N values for an N-tuple symbol from the Huffman lookup table; and
    returning one or more escape indicator bits from an entry of the Huffman lookup table, the entry corresponding to the N-tuple symbol.

2. The method of claim 1, wherein the step of returning the one or more escape indicator bits is performed substantially in parallel with the returning of the N values from the entry for the N-tuple symbol.

3. The method of claim 1, further comprising the steps of:
    prior to the step of performing, initializing a decoder to decode the N-tuple symbol, wherein the decoder performs all of the listed steps.

4. The method of claim 1, further comprising the steps of:
    checking whether any of the N values is indicative of one or more escape conditions, without comparing any of the N values to one or more escape thresholds, by checking the one or more escape indicator bits.

5. The method of claim 4, further comprising the steps of:
    prior to the step of performing, initializing a decoder to decode the N-tuple symbol, wherein the decoder performs all of the listed steps.

6. The method of claim 4, further comprising the step of:
    facilitating escape decoding when the step of checking indicates that the N-tuple symbol is indicative of the one or more escape conditions.

7. The method of claim 6, wherein the step of facilitating includes passing control to a user for resolving each escape condition.

8. The method of claim 6, wherein the step of facilitating includes resolving each escape condition using pre-defined, hard-coded escape handling logic.

9. A system for decoding a data stream, comprising:
    means for performing variable length decoding (VLD) lookup for an N-tuple symbol using a Huffman lookup table;
    means for returning N values for an N-tuple symbol from the Huffman lookup table; and
    means for returning one or more escape indicator bits from an entry of the Huffman lookup table, the entry corresponding to the N-tuple symbol, the means for returning the one or more escape indicator bits is accomplished substantially in parallel with the returning of the N values from the entry for the N-tuple symbol.

10. The system of claim 9, further comprising:
means for checking whether any of the N values is indicative of one or more escape conditions, without comparing any of the N values to one or more escape thresholds, by checking the one or more escape indicator bits.

11. A decoder lookup table, comprising:
one or more table entries, each table entry corresponding to at least one symbol and including a plurality of fields, wherein at least one of the plurality of fields includes one or more escape indicator bits,
wherein the at least one of the plurality of fields that includes the one or more escape indicator bits is different from another of the plurality of fields indicative of the at least one symbol for that table entry.

12. The decoder lookup table of claim 11, wherein the at least one symbol is a Huffman N-tuple symbol.

13. The decoder lookup table of claim 11, wherein the symbol is capable of being decoded from within a data stream and wherein the one or more escape indicator bits is capable of indicating, prior to decoding a symbol value for the symbol, that the symbol value represents an escape condition.

14. The decoder lookup table of claim 11, wherein the one or more table entries are defined for any of a plurality of media standards.

15. A method for decoding a sequence of Huffman symbols from a data stream, the method comprising the steps of:
defining a number of Huffman symbols to decode from the data stream;
setting a variable within the decoder to a value corresponding to the sequential number; and
checking the variable for whether at least one Huffman symbol remains to be decoded.

16. The method of claim 15, further comprising, if the step of checking the variable returns an affirmative result, the steps of:
performing variable length decoding (VLD) lookup for a Huffman symbol using a Huffman lookup table;
returning from the lookup table, a value for the symbol;
returning from the lookup table, substantially in parallel with returning the value, one or more escape indicator bits;
returning, substantially in parallel with returning the value, one or more use external help bits; and
checking whether the value is indicative of one or more escape conditions, without comparing the value to one or more escape thresholds, by checking the one or more escape indicator bits.

17. The method of claim 16, further comprising, if the step of checking the one or more escape indicator bits returns an affirmative result, the step of:
checking the one more use external help bits to see whether external help is needed for the indicated one or more escape conditions.

18. The method of claim 17, further comprising, if the step of checking the one or more use external help bits returns an affirmative result, the step of:
passing control to a user for resolving each escape condition.

19. The method of claim 17, further comprising, if the step of checking the one or more use external help bits returns a negative result, the steps of:

resolving each escape condition using pre-defined, hard-coded escape handling logic;
decrementing the variable; and
returning to the step of checking the variable.

20. The method of claim 19, further comprising, if the step of checking the one or more escape indicator bits returns a negative result, the steps of:
decrementing the variable; and
returning to the step of checking the variable.

21. The method of claim 15, further comprising, if the step of checking the variable returns a negative result, the step of:
ending the decoding of the sequence of Huffman symbols.

22. A decoder for decoding a sequence of Huffman symbols from a data stream, the decoder comprising:
means for defining a number of Huffman symbols to decode from the data stream;
means for setting a variable within the decoder to a value corresponding to the sequential number; and
means for checking the variable for whether at least one Huffman symbol remains to be decoded.

23. The decoder of claim 22, further comprising, if the means for checking the variable returns an affirmative result:
means for performing variable length decoding (VLD) lookup for a Huffman symbol using a Huffman lookup table;
means for returning from the lookup table, a value for the symbol;
means for returning from the lookup table, substantially in parallel with returning the value, one or more escape indicator bits;
means for returning, substantially in parallel with returning the value, one or more use external help bits; and
means for checking whether the value is indicative of one or more escape conditions, without comparing the value to one or more escape thresholds, by checking the one or more escape indicator bits.

24. The decoder of claim 23, further comprising, if the means for checking the one or more escape indicator bits returns an affirmative result:
means for checking the one more use external help bits to see whether external help is needed for the indicated one or more escape conditions.

25. The decoder of claim 24, further comprising, if the means for checking the one or more use external help bits returns an affirmative result:
means for passing control to a user for resolving each escape condition.

26. The decoder of claim 24, further comprising, if the means for checking the one or more use external help bits returns a negative result:
means for resolving each escape condition using pre-defined, hard-coded escape handling logic;
means for decrementing the variable; and
means for returning to the means for checking the variable.

27. The decoder of claim 23, further comprising, if the means for checking the one or more escape indicator bits returns a negative result:
means for decrementing the variable; and
means for returning to the means for checking the variable.

28. The decoder of claim 27, further comprising, if the means for checking the variable returns a negative result:
means for ending the decoding of the sequence of Huffman symbols.

29. A method for decoding a data stream, the method comprising the steps of:

initializing a decoder to decode an N-tuple symbol, the decoder carrying out the steps of:
  performing variable length decoding (VLD) lookup for the N-tuple symbol using a Huffman lookup table;
  returning from the lookup table, N values for the N-tuple symbol;
  returning from the lookup table, substantially in parallel with returning the N values, one or more escape indicator bits; and
  checking whether any of the N values is indicative of one or more escape conditions, without comparing any of the N values to one or more escape thresholds, by checking the one or more escape indicator bits.

30. The method of claim 29, wherein the Huffman lookup table comprises one or more entries, wherein each entry includes:
  a plurality of fields defining at least one of the N values, wherein one of the plurality of fields includes the one or more escape indicator bits.

* * * * *